(12) United States Patent
Franck et al.

(10) Patent No.: US 6,429,747 B2
(45) Date of Patent: Aug. 6, 2002

(54) SYSTEM AND METHOD FOR CONVERTING FROM SINGLE-ENDED TO DIFFERENTIAL SIGNALS

(75) Inventors: Stephen J. Franck, Felton; Zabih Toosky, Santa Cruz, both of CA (US)

(73) Assignee: Infineon Technologies North America Corp., San Jose, CA (US)

( * ) Notice: Subject to any disclaimer, the term of this patent is extended or adjusted under 35 U.S.C. 154(b) by 0 days.

(21) Appl. No.: 09/813,241

(22) Filed: Mar. 20, 2001

Related U.S. Application Data

(62) Division of application No. 09/296,142, filed on Apr. 21, 1999.

(51) Int. Cl.[7] ............................................. H03F 3/04
(52) U.S. Cl. ....................................... 330/301; 330/253
(58) Field of Search ................................ 330/253, 301, 330/311, 252

(56) References Cited

U.S. PATENT DOCUMENTS

| | | | |
|---|---|---|---|
| 3,743,764 A | * 7/1973 | Wittmann | 178/5.4 HE |
| 4,078,206 A | * 3/1978 | Crowle | 330/253 |
| 4,241,314 A | * 12/1980 | Iwamatsu | 330/253 |
| 4,292,597 A | 9/1981 | Niimura et al. | 330/254 |
| 4,369,411 A | * 1/1983 | Niimura et al. | 330/257 |
| 5,132,559 A | 7/1992 | Baskett | 307/355 |
| 5,220,286 A | 6/1993 | Nadeem | 330/9 |
| 5,382,919 A | 1/1995 | Lawston | 330/260 |
| 5,483,194 A | * 1/1996 | Genet | 330/253 |
| 5,521,552 A | * 5/1996 | Butler | 330/257 |
| 5,977,827 A | * 11/1999 | Dick | 330/252 |

FOREIGN PATENT DOCUMENTS

| | | |
|---|---|---|
| EP | 0 414 096 A2 | 2/1991 |
| EP | 0 472 340 A1 | 2/1992 |

* cited by examiner

*Primary Examiner*—Robert Pascal
*Assistant Examiner*—Henry Choe
(74) *Attorney, Agent, or Firm*—Fish & Richardson P.C.

(57) ABSTRACT

The present invention relates to a conversion circuit that converts a single-ended signal to differential signals. According to an embodiment of the present invention, crosstalk is avoided by insuring that none of the transistors in the conversion circuit are directly connected to ground. By not having a transistor directly connected to ground, ground current is avoided and crosstalk associated with ground current is eliminated.

2 Claims, 4 Drawing Sheets

US 6,429,747 B2

SYSTEM AND METHOD FOR CONVERTING FROM SINGLE-ENDED TO DIFFERENTIAL SIGNALS

This is a divisional of application Ser. No. 09/296,142 filed filed Apr. 21, 1999.

FIELD OF THE INVENTION

The present invention relates to a conversion circuit that may be used in a preamplifier circuit. In particular, the present invention relates to conversion of single-ended to differential signals.

BACKGROUND OF THE INVENTION

Preamplifier circuits are typically low-noise amplifiers incorporated into disk drives for the purpose of amplifying signals used in the disk drive. In meeting the low-noise requirements of the preamplifier, a single-ended signal may be converted to differential signals in an attempt to reduce or eliminate crosstalk. A single-ended signal is typically a signal defined by one voltage or current. A differential signal is typically a signal defined by the difference of two currents. Crosstalk is an undesired transfer of signals between system components.

Any noise on the current supply is typically noticeable on a single-ended signal since the current supply affects the single-ended signal without compensation. However, noise on the supply is typically not noticeable on a signal produced by differential signals since the noise is reflected on both the differential signals and therefore the resulting difference of the two signals is preserved. Accordingly, converting a single-ended signal to differential signals typically reduces crosstalk.

In a preamplifier circuit, there is typically some amplification (often referred to as gain) to a single-ended signal prior to the conversion of the single-ended signal to the differential signals. This single-ended gain may affect the current supply which in turn may affect the single-ended signal through the supply, causing crosstalk. Accordingly, this crosstalk typically limits the single-ended signals that could be passed through the single-ended to differential converter. Due to cross-talk, the current amplification of the preamplifier typically shuts off at high frequencies, since the impedance may become too high for the circuit to carry the high frequency signals.

Additionally, there may also be some crosstalk due to a current flowing into ground, commonly referred to as ground current. When current flows into ground, the ground may fluctuate. Since signals are measured in relation to ground, fluctuation of ground may cause fluctuation in the signal, causing cross-talk.

It would be desirable to have a single-ended to differential converter that prevents cross-talk. It would also be desirable for the single-ended to differential converter to process signals at higher frequencies. The present invention addresses such needs.

SUMMARY OF THE INVENTION

The present invention relates to a conversion circuit that converts a single-ended signal to differential signals. According to an embodiment of the present invention, crosstalk is avoided by insuring that none of the transistors in the conversion circuit are directly connected to ground. By not having a transistor directly connected to ground, ground current is avoided and crosstalk associated with ground current is eliminated.

Additionally, according to an embodiment of the present invention, the conversion circuit also amplifies the signal by a gain greater than one. Accordingly, the amplification which is typically performed prior to the signal being input into the conversion circuit may now be performed in the conversion circuit. By shifting the amplification from occurring prior to the conversion circuit to occurring in the conversion circuit, crosstalk between the current source and the single-ended input signal may also be avoided.

A system according to an embodiment of the present invention for converting a single-ended signal to differential signals is presented. The system comprises a first device configured to convert a current to voltage. The system also includes a second device coupled to the first device. The system further includes a third device coupled to the first device and second device, wherein not one of the first, second, and third device is directly connected to ground and wherein the current is amplified by a gain of more than two.

A method according to an embodiment of the present invention for converting a single-ended signal to differential signals is also presented. The method comprises converting a current to voltage; inputting a differential voltage to a differential pair; and amplifying the current by a gain of more than two, wherein approximately no ground current is produced.

DETAILED DESCRIPTION OF THE PREFERRED EMBODIMENTS

The following description is presented to enable one of ordinary skill in the art to make and to use the invention and is provided in the context of a patent application and its requirements. Various modifications to the preferred embodiments will be readily apparent to those skilled in the art and the generic principles herein may be applied to other embodiments. Thus, the present invention is not intended to be limited to the embodiment shown but is to be accorded the widest scope consistent with the principles and features described herein.

Figure 1:
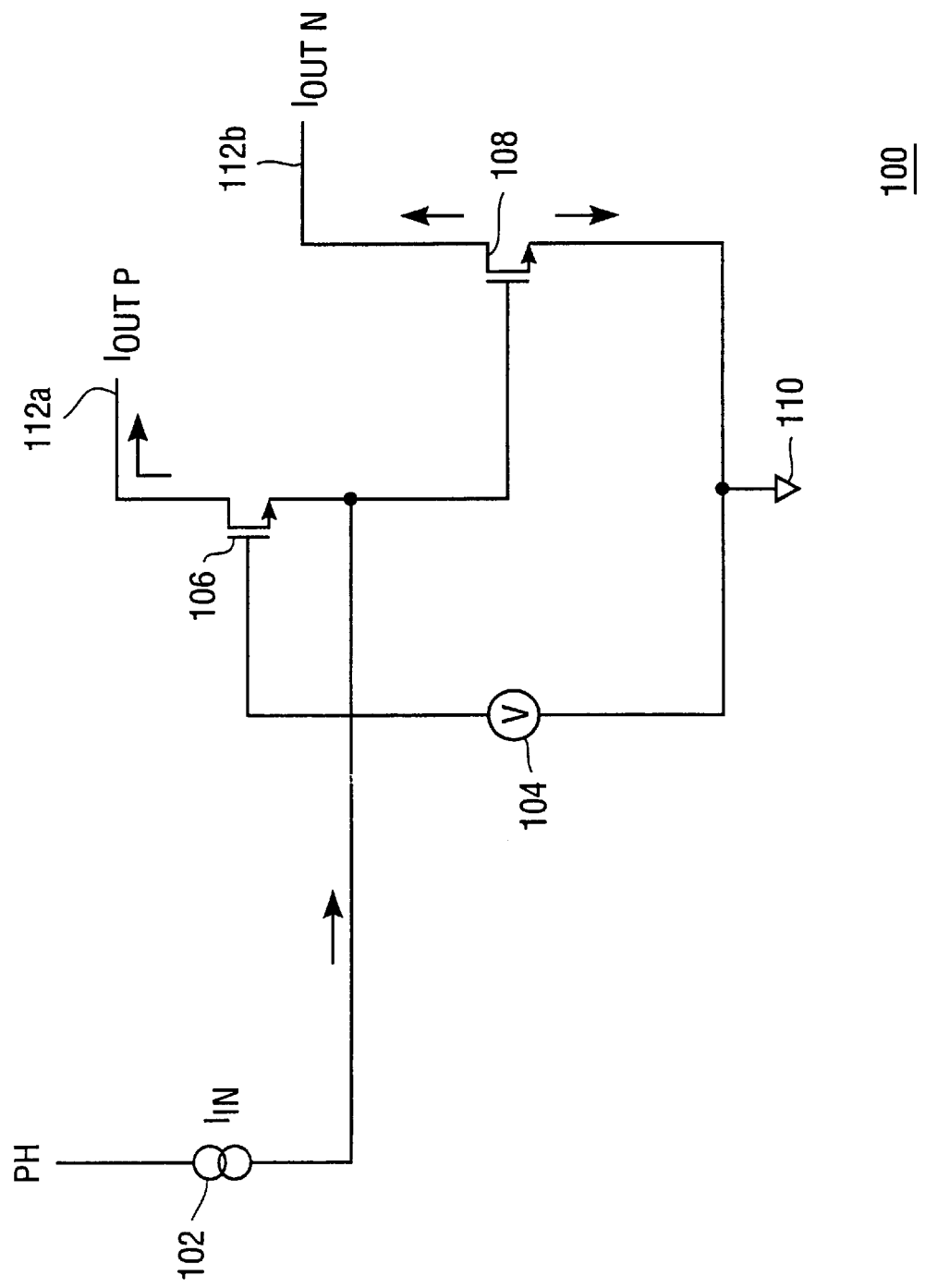
FIG. 1 is a schematic diagram of a conventional single-ended to differential signal conversion circuit.

FIG. 1 is a schematic diagram of an example of a conventional single-ended to differential signal conversion circuit. The conversion circuit 100 is shown to include a current supply 102, a volt meter 104, a ground 110, and transistors 106 and 108. An example of the type of transistors 106 and 108 is an enhanced n-type metal oxide semiconductor (NMOS). Enhanced NMOS transistors typically have positive threshold voltages.

An amplified single-ended current is input into the conversion circuit 100. The input current ($I_{in}$) meets impedance caused by transistor 106. This impedance converts ($I_{in}$) into voltage. Transistor 108 sees this voltage as a positive voltage and transistor 106 receives this voltage as a negative voltage. By definition, the amplification of the current through transistor 106 has a gain of one and the current gain of transistor 108 matches the gain of transistor 106. Accordingly, the current gain of transistor 108 is also one. Differential signals $I_{outP}$ 112a and $I_{outN}$ 112b are of the same magnitude. Accordingly, the differential circuit 100 has a current gain of two.

Since the single-ended signal is typically amplified prior to entering the differential circuit 100, there may be some crosstalk caused by the single-ended gain affecting the current supply. The effect on the current supply may in turn affect the signal-ended signal. This crosstalk may shut off the current gain of conversion circuit 100 at high frequencies, such as at a frequency of approximately 160 MHz.

There may also be some crosstalk in the conventional conversion circuit 100 due to a ground current flowing from transistor 108 to ground 110. As the signal is sent to ground 110, the ground 110 may fluctuate. Since all the signals are measured in terms of ground 110, all the signals also fluctuate, causing cross talk.

It would be desirable to have a single-ended to differential signal conversion circuit that avoids such crosstalk. It would also be desirable for the single-ended to differential converter to process signals at higher frequencies. The present invention addresses such needs.

Figure 2:
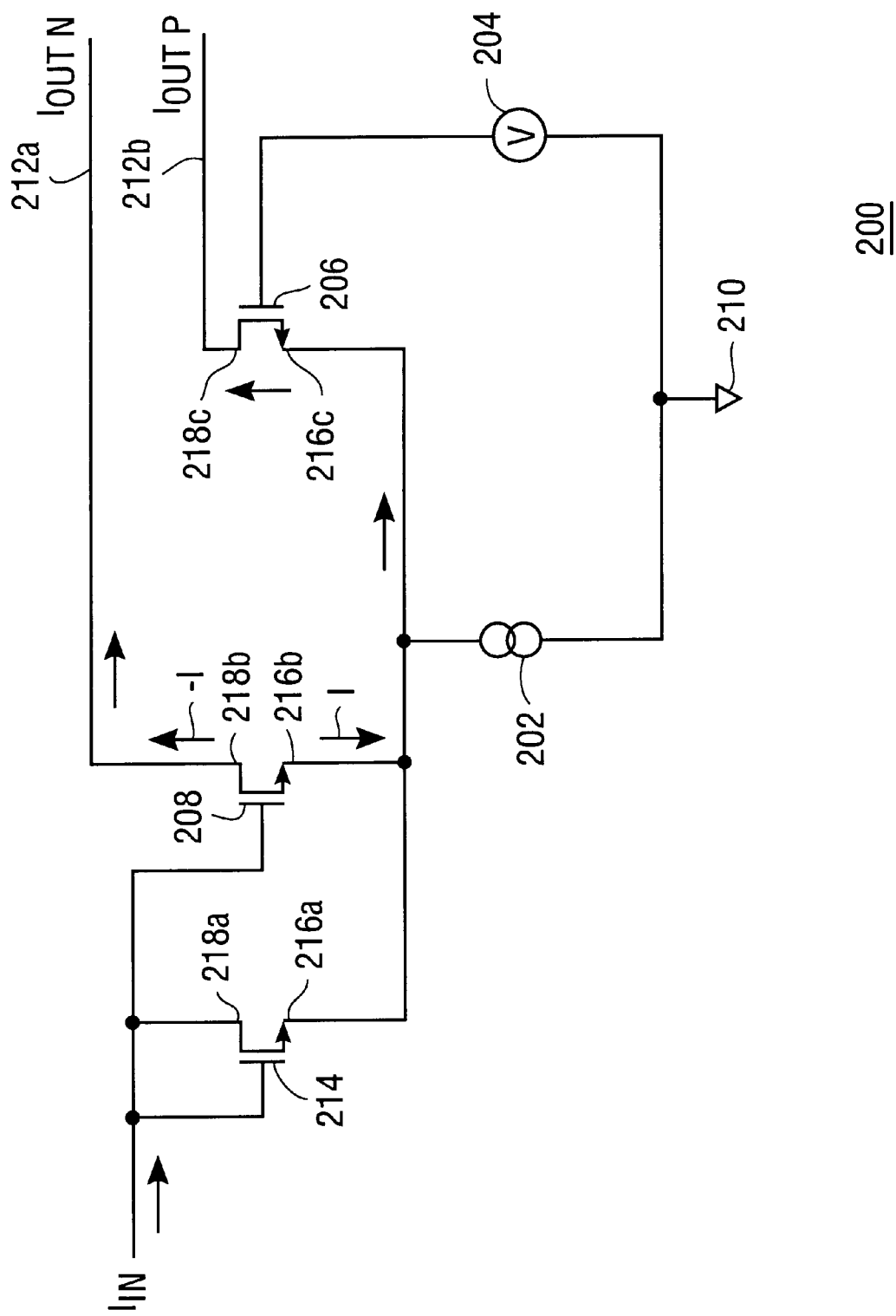
FIG. 2 is a schematic diagram of a single-ended to differential signal conversion circuit according to an embodiment of the present invention.

FIG. 2 is a schematic diagram of a single-ended to differential signal conversion circuit according to an embodiment of the present invention. FIG. 2 shows an example of a single-ended to differential signal conversion circuit 200 which is shown to include three transistors 214, 208, 206, a voltage source 204, a current supply 202, and a ground 210. An example of the type of transistors 214, 208, 206 to be used are NMOS transistors. The primary function of transistors 208 and 206 are to act as a differential pair. Voltage is input into transistors 208 and 206 and the voltage is converted into current to result in an output of a differential current.

A current is input ($I_{in}$) into the conversion circuit 200. An example of $I_{in}$ is approximately 0.5 milli-Amps with a signal of approximately 10 micro-Amps or about 1% of $I_{in}$. Transistor 214 converts $I_{in}$ to voltage. An example of the voltage converted by transistor 214 is approximately 10 milli-Volts at the input. There is a voltage drop at transistor 214 such that the voltage at the common transistor source 216a, 216b, and 216c is ½ V, where V is the input voltage. For example, ½ V at the common transistor source 216a, 216b, and 216c may be 5 milli-Volts. The current flows through transistor 214, adds to the current at transistor 208, and flows through source 216c of transistor 206 to flow out at $I_{out\,P}$ 212b. An example of $I_{out\,P}$ is approximately two milli-Amps of direct current (DC), with approximately forty micro-Amps of signal current.

To produce $I_{out\,N}$, $I_{in}$ flows through transistor 214, adds to the current at transistor 208, and is sent out of the circuit as $I_{out\,N}$ 212a. $I_{out\,N}$ and $I_{out\,P}$ are compliments of each other, accordingly, an example of $I_{out\,N}$ is approximately two milli-Amps of DC, with approximately forty micro-Amps of signal current. An example of the current at the current source 202 is approximately five milli-Amps. Note that in this conversion circuit 200, there is no current flowing into ground 210 since no device is directly connected to ground. Accordingly, there is no cross-talk from a ground current.

A further advantage of this conversion circuit 200 is that a significant current gain may be accomplished. For example, a current gain of eight may be accomplished by setting the ratio of the drain 218b of transistor 208 and the drain 218a of transistor 214 at a ratio of four to one, and the ratio of drain 218c of transistor 206 to the drain 218a of transistor 214 at a ratio of four to one. If drain 218b and drain 218c are set four times higher than drain 218a, then a current gain of four I occurs at transistor 208 and a current gain of four I occur at transistor 206, providing a total current gain of eight for the differential signal.

Accordingly, the single ended signal does not need to be amplified prior to being input into the conversion circuit 200. Since the single ended signal is not an amplified signal, there is no gain prior to the conversion circuit 200 to cause cross-talk with the current source. Additionally, the conversion circuit 200 is able to process signals at higher frequencies, such as frequencies up to approximately 200 MHz.

Figure 3:
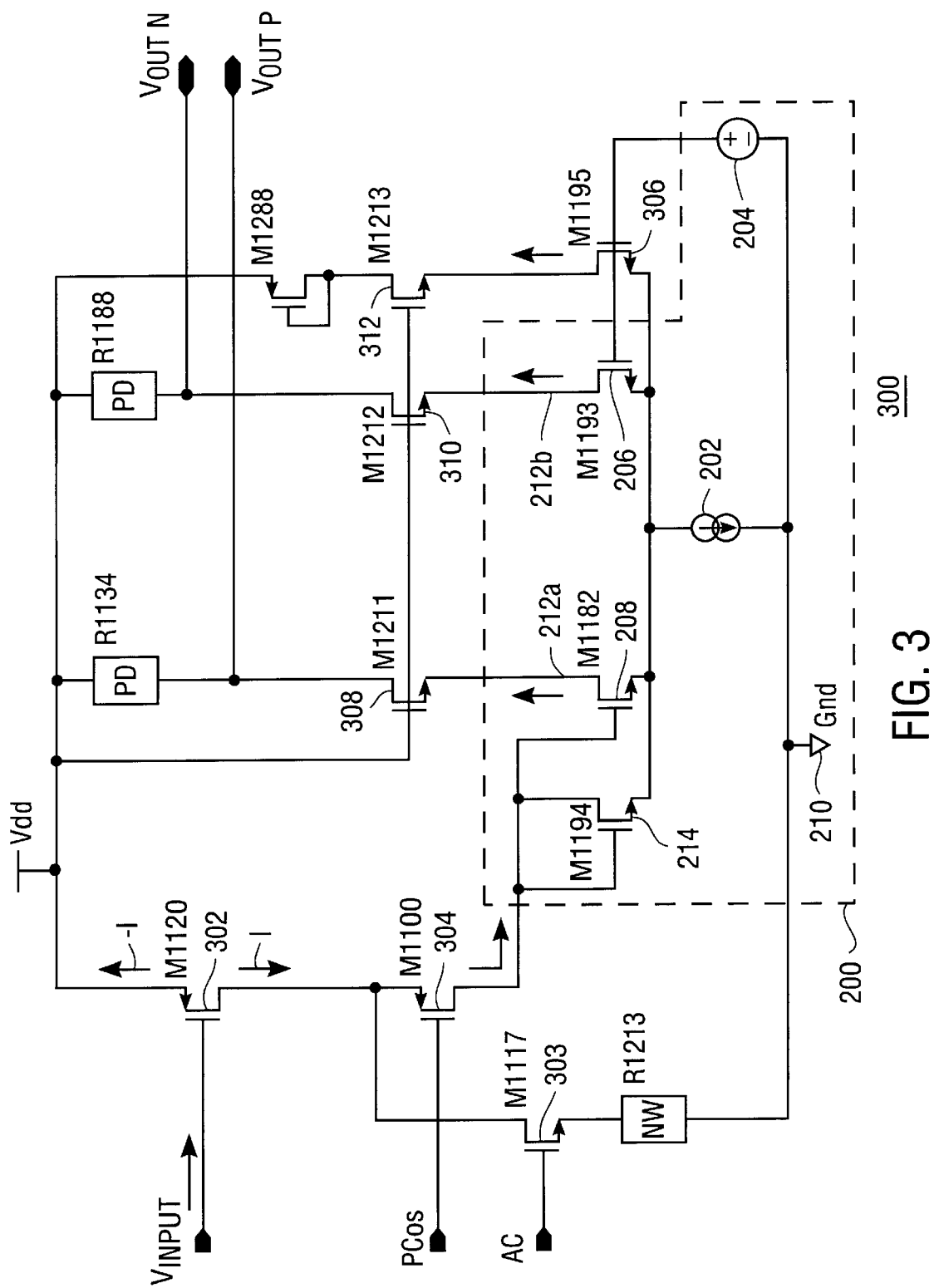
FIG. 3 is another schematic diagram of the single-ended to differential signal conversion circuit according to an embodiment of the present invention.

FIG. 3 is a schematic diagram of an example of the single-ended to differential signal conversion circuit 200 as incorporated into a larger conversion circuit, according to an embodiment of the present invention. An input voltage, such as 2 volts, is input into a conversion circuit 300. A transistor 302 converts the voltage into current. Transistor 304 passes the alternating current (AC) and transistor 303 balances the direct current (DC) component. An example of the current output of transistor 302 is approximately 1000 micro-Amps DC and 10 micro-Amps AC.

The current passes through transistor 304 which protects transistor 214 from capacitance. Transistor 304 acts as a cascode device which causes transistor 214 to see very low impedance and low gain. Cascode devices may be common gate transistors that pass current from source to drain with a voltage gain. The cascode devices may provide a low gain and low capacitance at the drains of transistors, such as transistor 214, an protect the drains of the transistors from an output voltage. Details of the workings of cascode devices are well known in the art. Once the current is input into circuit 200, events occur as described in conjunction with FIG. 2.

As previously described, a current is input ($I_{in}$) into the conversion circuit 200. Transistor 214 converts $I_{in}$ to voltage. There is a voltage drop at transistor 214 such that the voltage at the common transistor source 216a, 216b, and 216c is ½ V, where V is the input voltage. The current flows through transistor 214, adds to the current at transistor 208, and flows through source 216c of transistor 206 to flow out at $I_{out\,P}$ 212b. To produce $I_{out\,N}$, $I_{in}$ flows through transistor 214, adds to the current at transistor 208, and is sent out of the circuit as $I_{out\,N}$ 212a.

A transistor 306 may be coupled with circuit 200 in order to balance transistor 214. The current gain at transistor 306 is the negative of the current gain at transistor 214. For example, if transistor 214 has a current gain of 1, then transistor 306 has a current gain of −1. When a circuit is balanced, the current on transistors 208 and 206 are equal and the input current operates at the same average current as the current source 202.

Transistors 308–312 may also be coupled with circuit 200 to protect the output voltage from capacitance for transistors 208, 206, and 214, respectively, by acting as cascode devices which causes transistors 208, 206, and 214 to see very low impedance and low gain. Additionally, transistors 308–310 may be used as multiplexing switches that can be used to tristate the output into an off state. The use of such a cascode device as a tristate device is also well known in the art.

Figure 4:
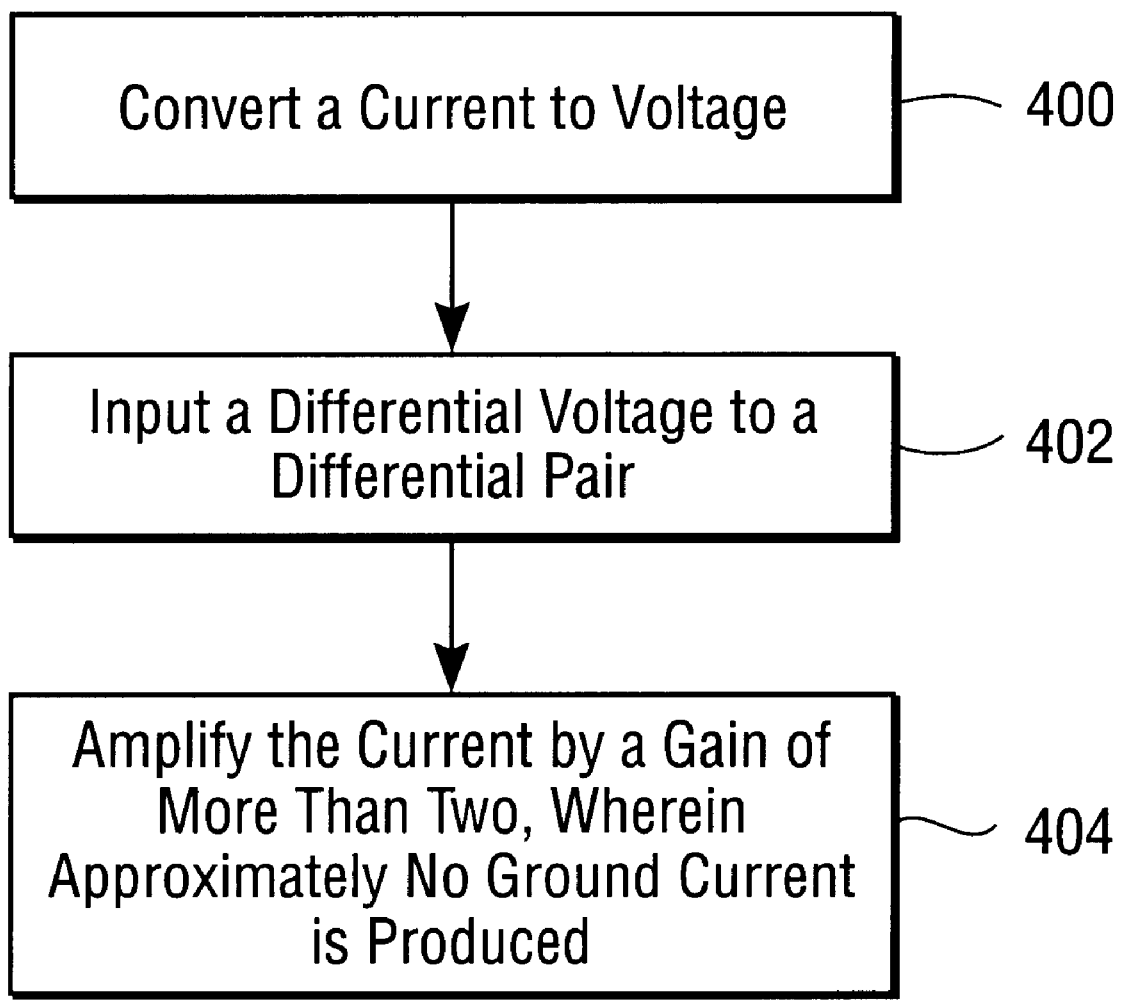
FIG. 4 is a flow diagram of a method according to an embodiment of the present invention of converting a single-ended signal to differential signals.

FIG. 4 is a flow diagram of a method according to an embodiment of the present invention for converting a single-ended signal to differential signals. An initial current is converted to a voltage (step 400). This voltage is used to create a differential voltage, and the differential voltage is input into a differential pair to produce differential currents (step 402). The initial current is also amplified by a gain of more than two, wherein approximately no ground current is produced (step 404).

Although the present invention has been described in accordance with the embodiment shown, one of ordinary skill in the art will readily recognize that there could be variations to the embodiment and these variations would be within the spirit and scope of the present invention. Accordingly, many modifications may be made by one of ordinary skill in the art without departing from the spirit and scope of the appended claims.

What is claimed is:

1. A system for converting a single-ended signal to differential signals, comprising:

a first device configured to convert a current to voltage;

a second device coupled to the first device;

a third device coupled to the first device and second device, wherein not one of the first, second, and third device is directly connected to ground, wherein the current is amplified by a gain of more than two, and wherein the second device and the third device are a differential pair; and a fourth device directly coupled to the third device, wherein the fourth device acts to balance current gain of the first device and causes the current through the second device and the third device to be equal.

2. A system for converting a single-ended signal to differential signals, comprising:

a first transistor configured to convert a single-ended input current to voltage;

a second transistor with its gate coupled to the drain of the first transistor and configured to output a first differential current through its drain;

a third transistor coupled to the second transistor and configured to output a second differential current through its drain; and a fourth transistor with its gate coupled to the gate of the third transistor and configured to balance the current gain of the first transistor so that the first current is substantially equal to the second current; wherein the first, second, third and fourth transistors share a common source.

* * * * *